United States Patent
Tsujimoto et al.

(10) Patent No.: US 7,776,155 B2
(45) Date of Patent: Aug. 17, 2010

(54) SURFACE MODIFIED QUARTZ GLASS CRUCIBLE AND ITS MODIFICATION PROCESS

(75) Inventors: Toshio Tsujimoto, Akita (JP); Yoshiyuki Tsuji, Akita (JP)

(73) Assignee: Japan Super Quartz Corporation, Tokyo (JP)

( * ) Notice: Subject to any disclaimer, the term of this patent is extended or adjusted under 35 U.S.C. 154(b) by 0 days.

(21) Appl. No.: 11/621,021

(22) Filed: Jan. 8, 2007

(65) Prior Publication Data

US 2007/0111151 A1 May 17, 2007

Related U.S. Application Data

(62) Division of application No. 10/162,656, filed on Jun. 6, 2002.

(30) Foreign Application Priority Data

Mar. 29, 2002 (JP) ................. 2002-94542

(51) Int. Cl.
*C30B 35/00* (2006.01)

(52) U.S. Cl. .............. 117/200; 117/213; 65/33; 427/376.2

(58) Field of Classification Search ........... 117/200, 117/213; 65/33; 427/376.2
See application file for complete search history.

(56) References Cited

U.S. PATENT DOCUMENTS

| | | | |
|---|---|---|---|
| 4,072,489 A | 2/1978 | Loxley et al. | |
| 4,093,017 A | 6/1978 | Miller, Jr. et al. | |
| 4,676,968 A | 6/1987 | Sanjurjo et al. | |
| 4,853,198 A | 8/1989 | Orii et al. | |
| 5,210,245 A | 5/1993 | Nappier | |
| 5,389,582 A | 2/1995 | Loxley et al. | |
| 5,530,122 A | 6/1996 | Dow et al. | |
| 5,547,987 A | 8/1996 | Bland et al. | |
| 5,730,800 A | 3/1998 | Sato et al. | |
| 5,976,247 A * | 11/1999 | Hansen et al. | 117/200 |
| 6,007,399 A * | 12/1999 | Mehrotra et al. | 445/50 |
| 6,106,610 A * | 8/2000 | Watanabe et al. | 117/13 |
| 6,126,740 A | 10/2000 | Schulz et al. | |
| 6,126,743 A | 10/2000 | Saegusa et al. | |
| 6,149,967 A * | 11/2000 | Mitamura et al. | 427/66 |
| 6,712,901 B2 | 3/2004 | Tsujimoto et al. | |
| 2002/0086119 A1* | 7/2002 | Hariharan et al. | 427/453 |
| 2003/0094131 A1 | 5/2003 | Tsujimoto et al. | |
| 2003/0106491 A1 | 6/2003 | Kemmochi et al. | |
| 2003/0183161 A1 | 10/2003 | Tsujimoto et al. | |
| 2004/0103841 A1 | 6/2004 | Tsujimoto et al. | |

FOREIGN PATENT DOCUMENTS

| | | |
|---|---|---|
| CN | 1149634 A | 5/1997 |
| CN | 1310325 A | 8/2001 |
| JP | 5-43498 | 2/1993 |
| JP | 08002932 A | 1/1996 |
| JP | 9-110590 | 4/1997 |
| JP | 2001-114590 | 4/2001 |
| JP | 2002-29890 | 1/2002 |
| WO | WO 94/24505 | 10/1994 |

* cited by examiner

*Primary Examiner*—Robert M Kunemund
*Assistant Examiner*—Matthew J Song
(74) *Attorney, Agent, or Firm*—Oblon, Spivak, McClelland, Maier & Neustadt, L.L.P.

(57) ABSTRACT

A surface modified quartz glass crucible and a process for modifying the crucible includes a layer of a metal oxide on the whole or a part of the inside and/or outside of the crucible, and baking it. At least an inside surface of the crucible is coated with a said metal oxide of magnesium, calcium, strontium or barium. The coated layer of the crucible does not abrade easily and provides a high dislocation free ratio of silicon single crystals pulled by using the crucible.

11 Claims, No Drawings

SURFACE MODIFIED QUARTZ GLASS CRUCIBLE AND ITS MODIFICATION PROCESS

This application is a Divisional application of U.S. Ser. No. 10/162,656, filed on Jun. 6, 2006, pending.

BACKGROUND OF THE INVENTION

1. Field of the Invention

The present invention relates to a surface modified quartz glass crucible and its modification process, in which the crucible is used in the process of pulling up silicon single crystal used for a semiconductor, etc., from molten silicon.

2. Discussion of the Background

As one of the causes that a dislocation is formed in a silicon single crystal during pulling up of the crystal, it has been known that cristobalite formed on the inside surface of the quartz glass crucible is released into the molten silicon. It is also known that a process in which an alkaline earth metal is coated on the inside surface of the crucible as a crystallization accelerator to form cristobalite layer on the inside surface of the crucible at an early sage of the pulling up (e.g. U.S. Pat. No. 5,976,247 or Japanese Pat. No. 3100836), is a counter measure to this problem. In these inventions, a barium hydroxide solution etc. is coated on the surface of the quartz glass crucible and the coated barium hydroxide reacts with carbon dioxide in air to form barium carbonate on the surface of the crucible. Then, the formed barium carbonate is weakly adhered on the surface of the crucible by drying it and is used as the crystallization accelerator.

However, the alkaline earth metals beryllium, magnesium, calcium, and strontium, have a large segregation coefficient, so that there is a fatal problem that these metals can be easily included in the single crystal silicon to significantly reduce its semiconductor properties. Moreover, although barium has a small segregation coefficient, there is also a problem that handling is difficult since its toxicity is high. Therefore, a quartz glass crucible having a surface layer which contains elements selected from zirconium, niobium, hafnium, tantalum, and rare earth elements, is also proposed (Japanese Patent Laid Open No. 2002-29890) instead of the alkaline earth metal.

However, there are the following problems in the above-described strategy.

That is, regarding the former quartz glass crucible, (A) since the barium carbonate powder on the surface of the crucible is only weakly adhered without any binder etc., the adhesion strength of the powder is so weak that the barium carbonate powder is abraded easily to a non-uniform adhesion state. Moreover there is also a possibility that the worker's health its injured because the barium carbonate powder is scattered. In addition, (B) the adhesion amount of barium carbonate becomes excessive easily. Furthermore, (C) if the crucible is washed, the barium carbonate powder adhered on the surface of the crucible is washed away. Therefore it is impossible to wash the crucible after the adhesion of the barium carbonate powder, even if some soils adhere on the surface of the crucible.

Moreover, regarding the latter quartz glass crucible, the surface modified layer is formed in a process wherein a coating liquid comprising a metal oxide dispersed in a sol state is coated on the surface of the crucible and dried at 150° C. in the atmosphere. However, the surface modified layer baked on the surface of the crucible cannot be formed by heat-treatment at such low temperature, so that the problem, i.e., the surface layer is abraded easily, cannot be solved.

SUMMARY OF THE INVENTION

The present invention solves these problems concerning the conventional quartz glass crucible, and provides a surface modified quartz glass crucible, which has the coated layer having the sufficient adhesion strength and durability, and its modification process.

Accordingly, the present invention provides the following surface modified quartz glass crucible.

[1] A quartz glass crucible for pulling up silicon single crystal having a coated layer of a metal oxide baked on the whole or a part of the inside and/or outside surface of the crucible.

The quartz glass crucible of this invention includes the following crucibles.

[2] A quartz glass crucible having a coated layer of metal oxide, which is baked on the whole or a part of at least the inside surface of the crucible

[3] A quartz glass crucible, wherein the metal oxide is one or more kinds of oxide of magnesium, calcium, strontium, or barium.

[4] A quartz glass crucible, wherein the amount of metal oxide on the surface of the crucible is $1 \times 10^{-9}$ to $1 \times 10_{-6}$ mol/cm$^2$, per unit area.

In addition, the present invention also provides the following surface modification process of the quartz glass crucible.

[5] A surface modification process of the quartz glass crucible, the process comprising, coating a coating liquid containing a metal salt on the whole or a part of the inside and/or outside surface of the crucible, drying the coated liquid, and baking the dried coated liquid at the higher temperature than the thermal decomposition temperature of the metal salt to bake the coated layer of the metal oxide on the surface of the crucible.

The surface modification process of the present invention also includes following processes.

[6] A surface modification process of the quartz glass crucible, wherein one or more kinds of organic acid salts of magnesium, calcium, strontium, or barium is used as the metal salt.

[7] A surface modification process of the quartz glass crucible, wherein a metal salt solution containing 0.01 to 15 weight % of a metal content being calculated as an oxide, is used as the coating solution.

[8] A surface modification process of the quartz glass crucible, the process also comprising, coating the coating liquid on the surface of the crucible, drying the coated liquid, and baking said coated liquid at 400 to 1200° C. for 10 to 120 minutes.

The surface modified quartz glass crucible of the present invention has a coated layer of metal oxide on the whole or a part of the inside and/or outside surface of the crucible. This metal oxide acts as a crystallization accelerator to the surface glass layer of the crucible at the high temperature in the process of pulling up the silicon single crystal. Therefore, when the crucible is used for pulling up the silicon single crystal, a uniform cristobalite layer is formed on the inside surface of the crucible at any early stage of pulling up, and as a result a high dislocation free ratio of pulled crystal can be obtained. Moreover, the strength of the crucible under the high temperature is increased by the uniform cristobalite layer formed on the inside or outside surface of the crucible.

Moreover, since the coated layer is an integrated structure to the surface of the crucible by baking, it is very stable and has high durability. Therefore, there is no abrasion when contacted with instruments or persons and no problem that the adhesion state of the metal oxide in the coated layer becomes non-uniform. In addition, the dislocation free ratio of silicon can be increased, since the uniform cristobalite layer is formed on the surface of the crucible during pulling up the single crystal even if the coating layer is comparatively thin. On the other hand, regarding a conventional quartz crucible having an adhered barium carbonate powder on its surface, since the adhesion strength of the barium carbonate powder is very weak, the powder can be washed away easily by water washing. Therefore, it is impossible to wash the crucible even if impurities are adhered on the surface of the crucible. While regarding the surface modified quartz glass crucible of the present invention, since the coated layer is baked on the surface of the crucible, it is not washed away during water washing. So that the impurities on the surface of the crucible can be removed easily to prevent the contamination of the silicon single crystal by such impurities to as great an extent as possible.

DETAILED DESCRIPTION OF THE PREFERRED EMBODIMENT

Hereafter, the invention is explained concretely according to the preferred embodiment.

The surface modified quartz glass crucible of the present invention is a quartz glass crucible for pulling up a silicon single crystal. The quartz glass crucible has a coated layer of metal oxide baked on the whole or a part of the inside and/or outside surface of the crucible. Moreover, it is preferable that the surface modified quartz glass crucible of the present invention has a coated layer of the metal oxide baked on at least the inside surface of the crucible, in which the metal oxide comprises one or more kinds of oxide of magnesium, calcium, strontium, or barium.

The coated layer containing the metal oxide can be formed by adhering a solution of a metal organic acid salt, such as a salt of magnesium, calcium, strontium or barium, and baking this solution at a temperature higher than the decomposition temperature of these salts. The most preferable of the above-mentioned metal organic acid salts is carboxylate. As an acyloxy group to form the carboxylate, the materials indicated by the general formula $C_nH_{2n+1}COO$, where n is integer of 3 to 7, are preferable. Concretely, the acyloxy group from n-butyric acid, α-methyl butyric acid, iso-valeric acid, 2-ethyl butyric acid, 2,2-dimethyl butyric acid, 3,3-dimethyl butyric acid, 2,3-dimethyl butyric acid, 3-methyl pentanoic acid, 1,4-methyl pentanoic acid, 2-ethyl pentanoic acid, 3-ethyl pentanoic acid, 2,2-dimethyl pentanoic acid, 3,3-dimethyl pentanoic acid, 2,3-dimethyl pentanoic acid, 2-ethyl hexanoic acid, or 3-ethyl hexanoic acid, etc., can be used suitably.

It is preferable that these organic acid salts are dissolved in an organic solvent. As a suitable organic solvent, an ester and/or an alcohol, or a mixed solvent, where carboxylic acid is further mixed to the ester and/or the alcohol, can be used. As the ester of the organic solvent, ethyl acetate, propyl acetate, n-butyl acetate, sec-butyl acetate, tert-butyl acetate, iso-butyl acetate, n-amyl acetate, sec-amyl acetate, tert-amyl acetate, and iso-amyl acetate, are preferable.

As alcohols, methanol, ethanol, 1-propanol, 2-propanol, 1-butanol, 2-butanol, iso-butyl alcohol, 1-pentanol, 2-pentanol, 2-methyl-2-pentanol, and iso-amyl alcohol, etc., are suitable. In alcohols, an alkoxy alcohol, i.e., the alcohol containing an ether group, is included. As the example of this kind of alcohols, 2-methoxyethanol and 1-methoxy-2-propanol can be used. Moreover, as examples of usable solvents, ketones, such as acetone, ethylmethylketone and methylsiobutylketone, and hydrocarbons, such as toluene, xylene, hexane and cyclohexane, etc., can be mentioned. It is usable to mix two or more kinds of these solvents.

It is preferable that the amount of the metal oxide on the surface of the crucible is $1 \times 10^{-9}$ to $1 \times 10^{-6}$ mol/cm² per unit area. In order to coat this amount of the metal oxide, it is suitable that the amount of the metal component in the coating liquid is 0.01 to 15 weight %, which is calculated as an oxide, and 0.5 to 10 weight % is preferable. When the amount of the metal component is less or more than said range, it is not preferable that the amount of the metal oxide on the surface of the crucible becomes less or more easily. In addition, when the amount of the metal oxide is less than said range, the desired effect cannot be obtained, and when the amount of the metal oxide is more than said range, the crystallized layer is abraded and dislocations are more likely to occur.

The coating liquid, such as the metal organic acid salt solution, is coated on the whole or a part of the inside and/or outside surface of the crucible. As the process for coating, a spray method, and a dipping method, etc. can be used. These coating processes are not limited. In addition, the coated area on the surface of the crucible can be on a part or the whole of the inside surface, or can be on a part or the whole of the outside surface, or can be on a part or whole of both the inside and outside surfaces. Moreover, in order to increase the dislocation free ratio of the pulled crystal by the crystallization accelerating effect with the metal oxide at the pulling up said crystal, it is necessary to coat at least the whole or a part of the inside surface of the crucible.

After coating the coating liquid on the surface of the crucible, the baking is done at a higher temperature than the thermal decomposition temperature of the metal salt. The baking temperature changes with the kind of the metal compounds, although, it is generally carried out at for example 400 to 1200° C. for 10 to 120 minutes. In addition, as the barium oxide coated layer shown in the Example, a coated layer baked at more than 600° C. for 30 minutes is preferable. When the baking temperature is too low, the coated layer cannot be baked on the surface of the crucible. Moreover, when the baking temperature is more than 1200° C., the crucible is devitrified. Baking at a suitable temperature forms a transparent coated layer of metal oxide of the metal. This coated layer is an integrated structure to the surface of the crucible because of baking the surface of the crucible, and is not abraded by contact with the surface.

Regarding the quartz glass crucible having a coated layer on its inside surface, the cristobalite layer is formed uniformly on its inside surface by the crystallization accelerating action of the metal oxide, such as barium etc., when the crucible is heated during pulling up of the single crystal. As the result, the dislocation free ratio of the pulled crystal is increased. Moreover, regarding the quartz glass crucible having a coated layer on its outside surface, since the crystallinity at the peripheral wall of said crucible is increased by cristobalite formation, the strength of the crucible at high temperature heating is increased, so that the deformation of the crucible can be prevented.

EXAMPLE

Hereafter, the present invention is explained with examples which are not intended to further limit the invention.

Example 1

A coating liquid comprising a toluene solution of 2-ethylhexanoic barium was sprayed to coat the whole of a surface of a quartz glass crucible and a layer was formed by heating the coated liquid at the temperatures and times shown in Table 1. The crucible was made by an arc fusion rotating mold method, which is generally used in the process to produce the crucible for pulling up a single crystal.

Moreover, regarding the below-described quartz glass crucibles, the comparative examples are shown in Table 4. They include a crucible that was sprayed similarly but the baking temperature was not sufficiently high (No. 7), a crucible that was not coated (No. 8), and a crucible in which barium carbonate powder was adhered by the conventional method but was not baked, (9).

Regarding said quartz glass crucibles, the strength of the coated layer was evaluated according to the specification standard (JIS 5600-5-4).

This evaluation was done by the scratching method using a marketed pencil (the trade name was Mitsubishi UNI). The results are shown in Table 1. Regarding the coated layers baked at more than 600° C., using the coating liquid having more than 0.01 weight % of the barium content (No9to No5), the scratching did not appear on the coated layer by using a pencil of hardness 6H. In addition, regarding the coated layer baked at more than 400° C. (No. 6), although a thin trace of scratching appeared by using a pencil of hardness 6H, the scratching did not appear by using a pencil of hardness 5H. On the other hand, regarding the coated layer baked at 200° C. (No. 7), since the baking was not sufficient, the scratching appeared by using a pencil of hardness 3H. Moreover, regarding the conventional coated layer (No. 9), which was not baked and the barium carbonate powder was only adhered on the surface, the scratching appeared by using the pencil of hardness 3H.

Next, regarding said quartz glass crucibles, the washing tests were done. These tests were done by measuring the amount of the residual metal oxide on the surface of the crucible after washing with pure water and drying. These results are also shown in Table 1. Regarding the quartz glass crucibles (No. 1to 6), in which the coated layers were formed under the suitable conditions of the present invention, barium was nearly unaffected by washing, and the adhesion amounts were not changed substantially. On the other hand, regarding the coated layer baked at 200° C. (No. 7), since the baking was not sufficient, the adhesion amount of barium was decreased to less than a half by washing. Moreover, regarding the conventional adhered layer (No. 9), since barium carbonate was not baked, almost all barium was washed away.

Furthermore, regarding said quartz glass crucibles, the pulling up tests of the single crystal silicon were done. The dislocation free ratios of the single crystal, are shown in Table 1. Regarding the quartz glass crucible (No. 1to No. 6), where the coated layers were formed under the conditions of the present invention, since cristobalite layers having the sufficient layer thickness were formed also with comparatively little barium amount, a high dislocation free ratio can be obtained. On the other hand, regarding the quartz glass crucible having the coated layer baked at 200° C. (No. 7), the cristobalite layer was thin, and the dislocation free ratio was remarkably low. In addition, regarding the conventional quartz glass crucible (No. 8), which does not have a coated layer, there was no crystallization layer, and regarding the conventional quartz glass crucible (No. 9), where the barium carbonate powder was adhered, the cristobalite layer was thin. Therefore, the dislocation free ratios of these tests (No. 8and 9), were remarkably low.

Example 2

Regarding a quartz glass crucible having the coated layer shown in No. 3in Table 1, a multi-pulling test was done, in which the pulling up of the silicon single crystal was repeated by charging the polysilicon into the crucible again after the pulling up the single crystal. In addition, said recharging was done without lowering the temperature. These results are shown in Table 2. Moreover, the result of the comparison test of the conventional quartz glass crucible having the barium carbonate powder (No. 9) in Table 1, is also shown in Table 2.

TABLE 1

| No. | Coating liquid metal kinds: Amounts | Solvent | Baking °C. | Minutes | Hardness by Pencil | Adhesion Amounts of Barium Oxide Before washing | After washing | Pulling up single Crystal Yield | Crystal layer thickness |
|---|---|---|---|---|---|---|---|---|---|
| 1 | Ba: 1 | Toluene | 850 | 30 | No | 52 | 52 | 82 | 130 |
| 2 | Ba: 0.1 | Toluene | 850 | 30 | cracking | 15 | 15 | 84 | 110 |
| 3 | Ba: 0.01 | Toluene | 850 | 30 | by 6H | 1 | 1 | 85 | 80 |
| 4 | Ba: 0.01 | Toluene | 700 | 30 | | 1 | 1 | 81 | 70 |
| 5 | Ba: 0.01 | Toluene | 600 | 30 | | 1 | 2 | 81 | 65 |
| 6 | Ba: 0.01 | Toluene | 400 | 30 | Cracking appeared by 3H | 1 | 0.9 | 80 | 60 |
| 7 | Ba: 0.01 | Toluene | 200 | 30 | Cracking appeared by 3H | 1 | 0.3 | 55 | 10 |
| 8 | Non-surface treatment | | | | | 0 | 0 | 35 | 0 |
| 9 | Conventional Crucible Having Ba Carbonate Powder | | | | Cracking appeared by 3H | 1 | 0.3 | 55 | 10 |

(Note):
Metal amounts in coating liquid (Ba Amounts) are amounts calculated as an oxide (wt %), yield is %, crystal layer thickness is μm, and adhesion amounts of barium oxide is calculated as barium oxide.

Regarding the quartz glass crucible having the coated layer of the present invention (No. 3), a cristobalite layer was formed uniformly on the inside surface of the crucible by the crystallization accelerator contained in the coated layer, and the releasing of cristobalite was stopped. Therefore, even when the pulling up of the single crystal was repeated 4 times, a high dislocation free ratio, which was the level of 80%, was kept. As a result, the crucible life was prolonged. On the other hand, regarding the conventional quartz glass crucible having adhered barium carbonate powder (No. 9), the cristobalite was deposited non-uniformly and partially as the pulling up was repeated. The frequency of cristobalite releasing to the molten silicon, increases, so that the dislocation free ratio was decreased gradually. In addition, regarding the crucible, in which the pulling up of the single crystal was repeated 4 times, the cristobalite layer was not identified on the surface of the crucible. By the way, regarding the conventional quartz glass crucible having adhered barium carbonate powder (No. 9), it is necessary that the amount of adhered barium is more than 20 μm/g for obtaining the multi-pulling effect, which was the same as the present invention. When such a large amount of barium is adhered on the surface of the crucible, it cannot be avoided to negatively influence the quality of the single crystal silicon.

TABLE 2

| | Number of Times of Pulling up | | | |
|---|---|---|---|---|
| | 1 | 2 | 3 | 4 |
| Coated Crucible | 87 | 86 | 84 | 84 |
| Conventional Crucible Having Adhered Barium Carbonate Powder | 55 | 50 | 47 | 42 |

Regarding the quartz glass crucible of the present invention, the coated layer containing the metal oxide having the crystallization accelerating effect, is formed on the surface of the crucible to become integrated structure by baking, so that there is no abrasion. Therefore, the adhesion state of the metal oxide in the coated layer can be kept uniform, and the cristobalite can form uniformly on the surface of the crucible during the pulling up of the single crystal, so that a high dislocation free ratio can be obtained. In addition, since the coated layer is not abraded easily by contacting the crucible, there is no conventional problem that the fine barium carbonate powder is scattered whenever the case containing the crucible is opened.

Japanese Application 2002-94542, filed on Mar. 29, 2002 is incorporated herein by reference in its entirety.

Obviously, numerous modifications and variations of the present invention are possible in light of the above teachings. It is therefore to be understood that within the scope of the appended claims, the invention may be practiced otherwise than as specifically described herein.

What is claimed is:

1. A quartz glass crucible, comprising:
a quartz glass crucible having a coating layer on an inside surface, wherein the coating layer consists of a metal oxide,
wherein the metal oxide is at least one oxide selected from the group of oxides consisting of magnesium, calcium, strontium, and barium oxide,
wherein the coating layer is a transparent structure integrated with the inside surface of the crucible, and
wherein said coating layer is baked on at least a portion of an inside surface of said crucible, the coating layer of the metal oxide is baked on the surface of the crucible at a temperature of from 600° C. to 1,200° C. for from 10 to 120 minutes, and the coating layer of the metal oxide is baked on at least a portion of the inside of the crucible with a strength of a pencil hardness of at least 6H according to JIS 5600-5-4.

2. The quartz glass crucible according to claim 1, wherein the amount of the metal oxide on the surface of the crucible is from $1 \times 10^{-9}$ to $1 \times 10^{-6}$ mol/cm$^2$.

3. The quartz glass crucible according to claim 1, wherein the amount of the coating layer adhered to the inside of the crucible is not decreased after washing with pure water and drying.

4. The quartz glass crucible according to claim 1, wherein the coating layer of the metal oxide has a thickness of from 65 to 130 μm.

5. The quartz glass crucible according to claim 1, having a cristobalite layer uniformly formed on the inside surface of the crucible by the crystallization accelerating action of the metal oxide in the coating layer.

6. The quartz glass crucible according to claim 5, wherein the cristobalite layer does not release during the pulling up of a single crystal silicon.

7. The quartz glass crucible according to claim 5, wherein the cristobalite layer is uniformly coated on the coating layer of the crucible.

8. The quartz glass crucible according to claim 1, wherein the coating layer of the metal oxide is not abraded by contact.

9. The quartz glass crucible according to claim 1, wherein the coating layer of the metal oxide is baked on the crucible by heating the crucible to a temperature of from 600 to 1,200° C. after coating the inside surface of the crucible with a layer of a metal carbonate.

10. The quartz glass crucible according to claim 1, wherein the coating layer of the metal oxide is baked on the crucible by heating the crucible to a temperature of from 600 to 1,200° C. to both form the layer of the metal oxide and to bake the metal oxide on to the surface of the crucible.

11. The quartz glass crucible according to claim 1, wherein the coating layer is on the whole portion of the inside surface of the crucible.

* * * * *